(12) United States Patent
Huang

(10) Patent No.: US 7,009,544 B2
(45) Date of Patent: Mar. 7, 2006

(54) DIGITAL TO ANALOG CONVERTER AND SIGNAL CONVERTING METHOD FOR THE SAME

(75) Inventor: Chen-Chih Huang, Hsin Chu (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/860,022

(22) Filed: Jun. 4, 2004

(65) Prior Publication Data

US 2004/0246155 A1 Dec. 9, 2004

(30) Foreign Application Priority Data

Jun. 9, 2003 (TW) .................................. 092115592

(51) Int. Cl.
*H03M 1/66* (2006.01)
(52) U.S. Cl. ...................................... 341/144; 341/145
(58) Field of Classification Search ................ 341/144, 341/143, 145, 118, 120
See application file for complete search history.

(56) References Cited

U.S. PATENT DOCUMENTS

| | | | | |
|---|---|---|---|---|
| 5,579,341 A | * | 11/1996 | Smith et al. ................. | 375/267 |
| 5,594,439 A | * | 1/1997 | Swanson ..................... | 341/118 |
| 6,150,970 A | * | 11/2000 | Anagnos ..................... | 341/144 |
| 6,344,814 B1 | * | 2/2002 | Lin et al. .................... | 341/144 |
| 6,522,176 B1 | * | 2/2003 | Davis ......................... | 327/105 |
| 6,535,154 B1 | * | 3/2003 | Sculley ....................... | 341/143 |

* cited by examiner

*Primary Examiner*—Peguy Jeanpierre
*Assistant Examiner*—Jospeh Lauture
(74) *Attorney, Agent, or Firm*—Birch, Stewart, Kolasch & Birch, LLP

(57) ABSTRACT

A digital to analog converter (DAC) converts a plurality of digital input data into a plurality of analog output signals. The DAC includes an element pool having a plurality of elements, a random number generator for converting the digital input data into a set of control signals, a plurality of summing nodes for generating analog output signals, and a plurality of switches for connecting the elements to the summing nodes. The switches are controlled by the control signals. Because of the control of the random number generator, the element signals transferring to the summing nodes can be used alternatively and simultaneously.

20 Claims, 7 Drawing Sheets

| Time Point | T0 | T1 | T2 | T3 | T4 | T5 | T6 | T7 |
|---|---|---|---|---|---|---|---|---|
| $D_A$ | 0 | 1 | 2 | 3 | 4 | 1 | 2 | 3 |
| $D_B$ | 0 | 4 | 3 | 2 | 1 | 4 | 4 | 0 |
| CA8~CA1 | 00000000 | 00000001 | 00100001 | 01100001 | 11100001 | 10000000 | 10000001 | 10100001 |
| CB8~CB1 | 00000000 | 00011110 | 00011100 | 00011000 | 00010000 | 00011110 | 00011110 | 00000000 |

FIG. 4A

| | | | |
|---|---|---|---|
| T0 | I:(Empty Queue) | Q:(Empty Queue) | P: $E_1$ $E_2$ $E_3$ $E_4$ $E_5$ $E_6$ $E_7$ $E_8$ |
| T1 | I: $E_1$ | Q: $E_2$ $E_3$ $E_4$ $E_5$ | P: $E_6$ $E_7$ $E_8$ |
| T2 | I: $E_1$ $E_6$ | Q: $E_3$ $E_4$ $E_5$ | P: $E_7$ $E_8$ $E_2$ |
| T3 | I: $E_1$ $E_6$ $E_7$ | Q: $E_4$ $E_5$ | P: $E_8$ $E_2$ $E_3$ |
| T4 | I: $E_1$ $E_6$ $E_7$ $E_8$ | Q: $E_5$ | P: $E_2$ $E_3$ $E_4$ |
| T5 | I: $E_8$ | Q: $E_5$ $E_2$ $E_3$ $E_4$ | P: $E_1$ $E_6$ $E_7$ |
| T6 | I: $E_8$ $E_1$ | Q: $E_5$ $E_2$ $E_3$ $E_4$ | P: $E_6$ $E_7$ |
| T7 | I: $E_8$ $E_1$ $E_6$ | Q: (Empty Queue) | P: $E_7$ $E_5$ $E_2$ $E_3$ $E_4$ |

FIG. 4B

DIGITAL TO ANALOG CONVERTER AND SIGNAL CONVERTING METHOD FOR THE SAME

This application claims the benefit of Taiwan application Serial No. 092115592, filed Jun. 9, 2003.

BACKGROUND OF THE INVENTION

1. Field of the Invention

The invention relates to a digital to analog converter (DAC), and more particularly, to a DAC with reduced errors among a plurality of digital to analog converting units.

2. Description of the Related Art

A digital to analog converter (DAC) is typically composed of several DAC elements, which receive digital input data and generate element signals according to the digital input data. The element signal can be voltage type or current type. Then, a signal integrator (or a summing node) adds the element signals outputted from the DAC elements and generates an analog output signal.

FIG. 1 illustrates a schematic diagram of a conventional DAC. As shown in FIG. 1, the DAC 10 includes a plurality of DAC elements, i.e., current sources E1~En, a plurality of switches SA1~SAn, and a summing node 11. The ON/OFF state of each of the switches SA1 to SAn is controlled by each bit of the digital input data. The ON/OFF state of each of the switches SA1 to SAn determines the connection relationship between each of the DAC elements E1 to En and the summing node 11. The summing node 11 generates an analog output signal according to the connected element signals. Therefore, the digital input data controls the ON/OFF state of each of the switches SA1 to SAn so as to generate the corresponding analog output signal. The DAC 10 is widely used in several fields, such as the fields of communications, voice-frequency, radio frequency, and the like. In some applications, two or more DACs with a small error therebetween are required.

FIG. 2 illustrates a conventional DAC system with two DACs. The conventional DAC system 20 has two DACs 21 and 22 with the same structure and components to generate two analog output signals. Owing to the variations such as those happened in manufacturing process, it tends to be errors between the two analog output signals even with the two digital input data being the same. The error is unacceptable if it exceeds an allowable range. For example, in the application of the radio intranet (IEEE 802.11a), the error requirement between the DACs of the I-channel transmitter and the Q-channel transmitter has to be smaller than 0.1%.

SUMMARY OF THE INVENTION

One of the objects of the invention is therefore to provide a DAC system for reducing the errors between the DACs by using common DAC elements.

Another object of the invention is to provide a DAC system for reducing the errors between the DACs by alternatively outputting the element signals from the DAC elements to summing nodes.

To achieve the above-mentioned object, the invention provides a digital to analog converter (DAC) system for outputting a first analog output signal and a second analog output signal according to a first digital input data and a second digital input data, respectively. The DAC system comprises a plurality of DAC elements generating a plurality of element signals; and a control signal generator generating a control signal according to the first and the second digital input data; a first summing node receiving a first part of the element signals according to the control signal and generating the first analog output signal; and a second summing node receiving a second part of the element signals according to the control signal and generating the second analog output signal.

The invention further provides a method for converting a first digital input data and a second digital input data into a first analog output signal and a second analog output signal, respectively. The method comprises the steps of producing a control signal according to the first and second digital input data; dividing a plurality of basic elements into at least a first element set and a second element set according to the control signal; and generating the first and second analog output signals according to the first element set and the second element set, respectively.

BRIEF DESCRIPTION OF THE DRAWINGS

FIG. 4A shows the relationship between the first and second digital input data and the first and second control signals at each time point;

FIG. 4B shows the elements assigned to each queue corresponding to FIG. 4A;

DETAILED DESCRIPTION OF THE INVENTION

Figure 1:
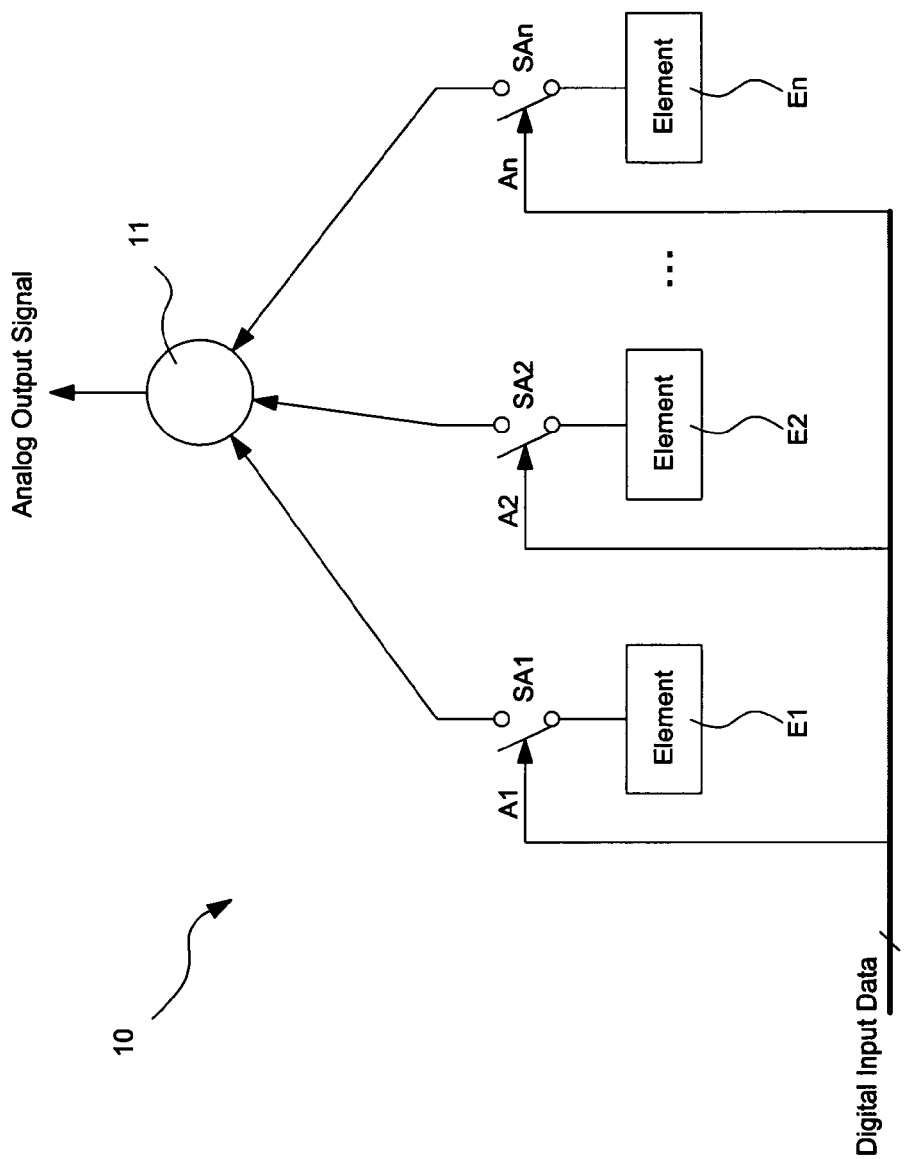
FIG. 1 illustrates a schematic diagram of a conventional DAC.
Figure 2:
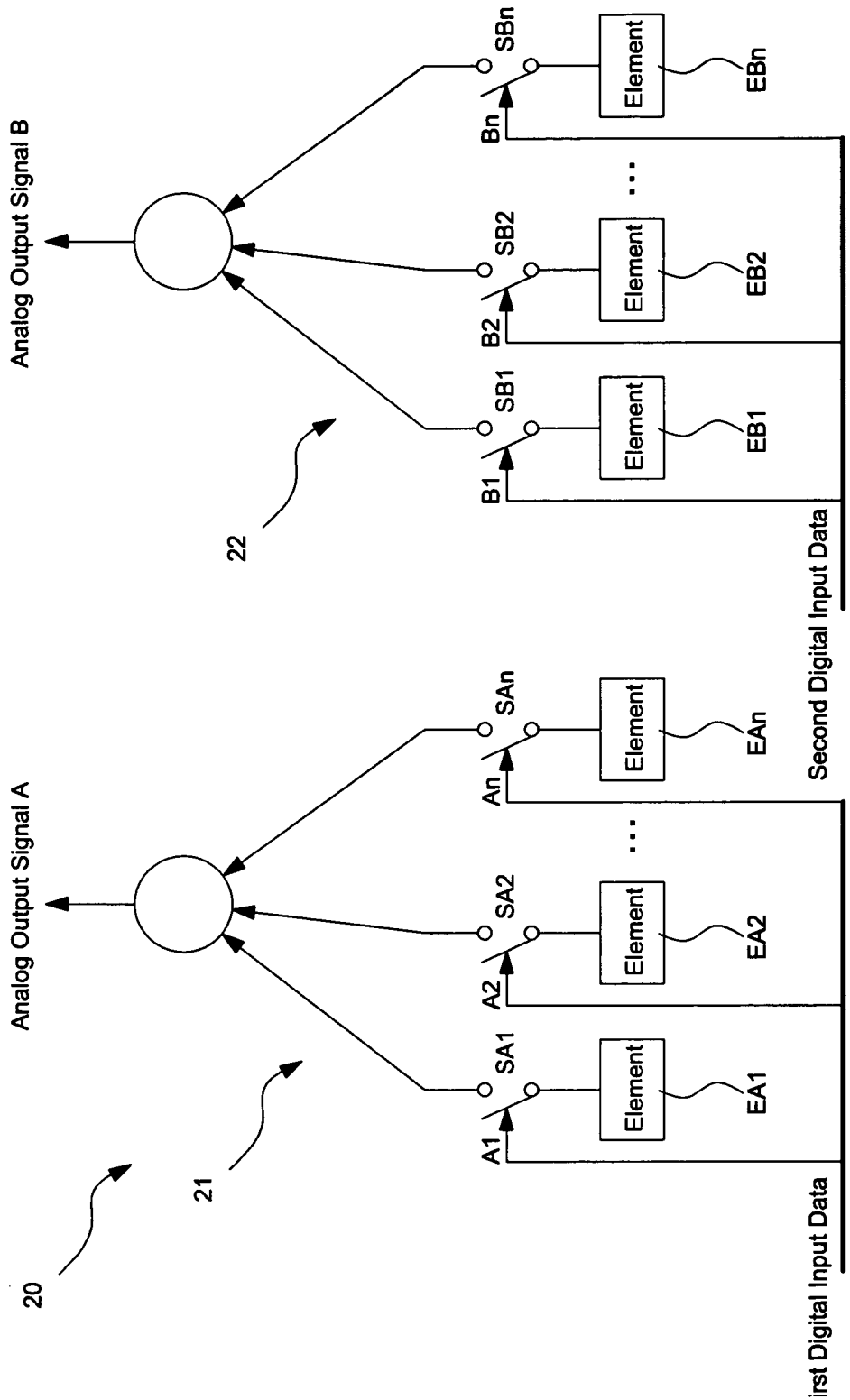
FIG. 2 illustrates a conventional DAC system having two DACs.
Figure 3:
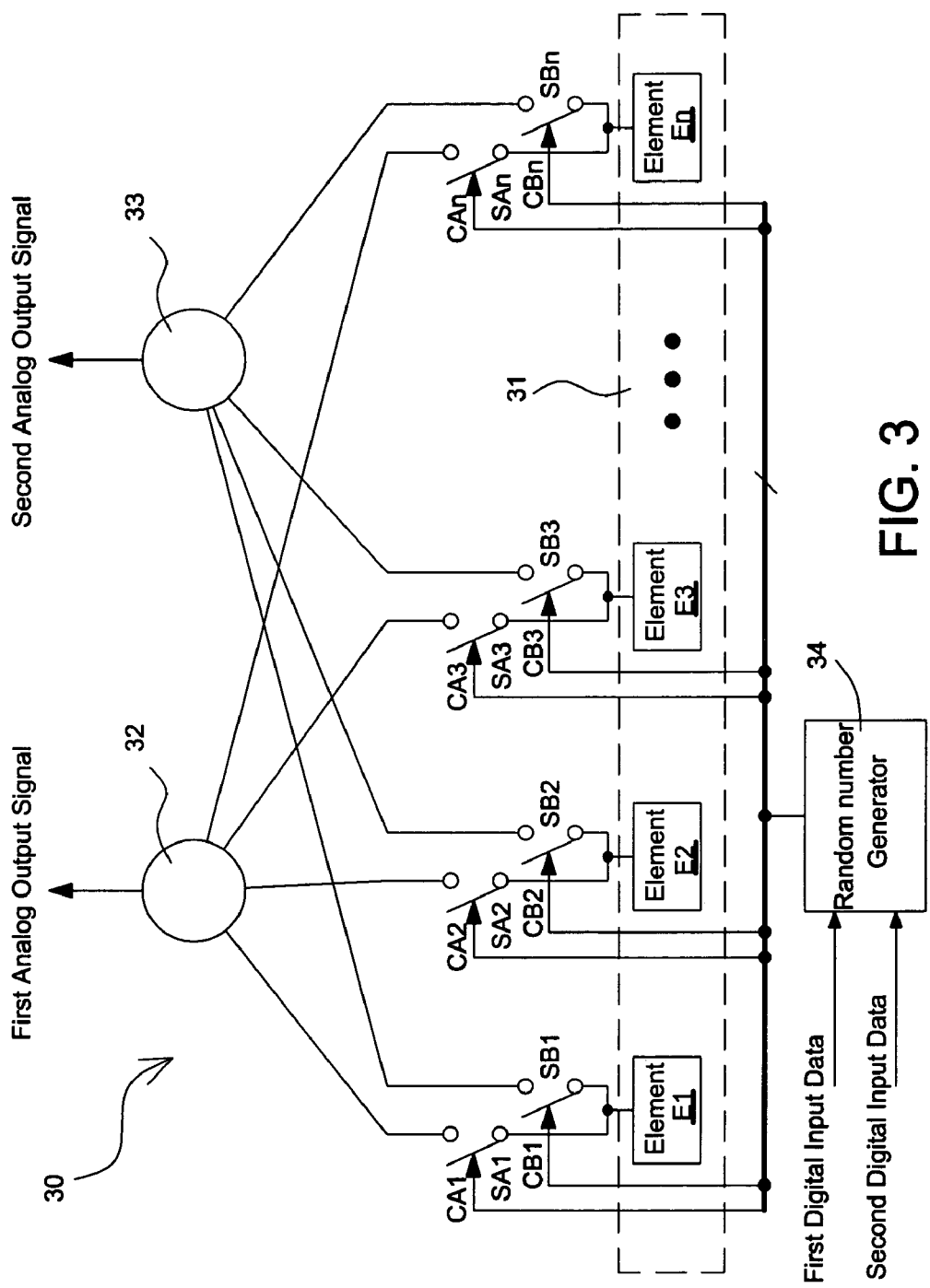
FIG. 3 illustrates the architecture diagram of the DAC system according to an embodiment of the invention.

FIG. 3 illustrates the architecture diagram of the DAC system according to an embodiment of the present invention. Referring to FIG. 3, the DAC system 30 includes an element pool 31, a plurality of switches SA1~SAn and SB1~SBn, two summing nodes 32 and 33, and a random number generator 34. The summing nodes 32, 33 generate a first analog output signal and a second analog output signal, respectively. Thus, the embodiment outputs two analog output signals. Of course, the DAC system 30 may utilize more than two summing nodes to provide more than two analog output signals, as may be appreciated by those of ordinary skill in the art.

In this embodiment, the element pool 31 includes a plurality of DAC elements E1~En, which are substantially the same. The DAC system 30 utilizes two switches SA and SB to couple each DAC element to the two summing nodes 32 and 33, respectively. The ON/OFF states of the two switches SA and SB are controlled by the first and second random control signals CA and CB, in order to control the connection/disconnection of the element signals of the DAC elements to the summing nodes 32 and 33. For example, the element signal of the DAC element E1 is connected to the summing nodes 32 and 33 through the switches SA1 and SB 1. In an embodiment, the switches SA1 and SB1 are designed not to be turned on simultaneously but may be turned off simultaneously. Similarly, the element signal of the DAC element E2 is connected to the summing nodes 32 and 33 through the switches SA2 and SB2, and so on. The DAC system 30 utilizes the random number generator 34 to receive two digital input data $D_A$ and $D_B$, and to output the first and second random control signals CA1~CAn and CB1~CBn according to the two received digital input data $D_A$ and $D_B$. Therefore, it is possible to control each of the DAC elements E1~En among the element pool 31 to be selectively coupled to the summing nodes 32 or 33, and as a result, the first and second analog output signals respectively correspond to the digital input data $D_A$ and $D_B$.

Although the embodiment of FIG. 3 provides two analog output signals, the architecture of the DAC system may also be modified to provide multiple analog output signals as long as the number of summing nodes is increased. It should be noted that the total number of DAC elements in the element pool 31 is not required to be exactly the same as the sum of the numbers of DAC elements in two separate DACs. Instead, it is enough to have a total number of DAC elements in the element pool 31 that is sufficient to provide a maximum output bit number simultaneously required by such two DACs. Of course, the resolution of two digital input data $D_A$ and $D_B$ can be different. Moreover, the DAC elements may be of different types. For example, the DAC element in a resistor string DAC is a resistor; the DAC element in a charge-redistribution switched-capacitor DAC is a capacitor; and the DAC element in a current-steering DAC is a current source.

There are several ways to generate the random control signals for the DAC system 30. FIG. 4 shows an example of the random control signals of the random number generator, wherein FIG. 4A shows the relationship between the digital input data $D_A$, $D_B$ and the random control signals CA, CB at each time point, and FIG. 4B shows the DAC elements assigned to each set of outputs corresponding to FIG. 4A. The first digital input data $D_A$ corresponds to the first random control signal (CA1 to CAn) of FIG. 3 for controlling the switches SA1 to SAn, while the second digital input data $D_B$ corresponds to the second random control signal (CB1 to CBn) of FIG. 3 for controlling the switches SB 1 to SBn. In FIG. 4, it is assumed that the element pool 31 has eight DAC elements E1 to E8, whereof the output element signals are of substantially the same current amount, while output signal errors caused by manufacturing process variation exist. In addition, I and Q are assumed to be the queues used in the random control signals CA and CB, respectively. P is the queue of the element pool.

A method of generating the random control signal according to an embodiment of the invention is described as follows. When the newly-inputted digital input data $D_A$ (or $D_B$) is greater than the current digital input data $D_A$-1 (or $D_B$-1), the required element number is pulled from the queue P and is pushed into the queue I (or Q); and when the newly-inputted digital input data $D_A$ (or $D_B$) is smaller than the current digital input data $D_A$-I (or $D_B$-I), the redundant element number is pulled from the queue I (or Q) and is pushed back to the queue P. When the newly-inputted digital input data $D_A$ (or $D_B$) is equal to the current digital input data $D_A$-I (or $D_B$-I), the queues I, Q and P remain unchanged. Thereafter, the switches are controlled according to the contents of the queues I and Q. As can be appreciated by those of ordinary skill in the art, the architecture of a common element pool with multiple analog output signals eliminates potential errors existing among different DACS, and randomized control signals also serve the error balancing purpose. Therefore, the obtained relative error between the two analog output signals gets significantly smaller.

The switch operation at each time point will be described with reference to FIGS. 4A and 4B.

Time point To: when the digital input data $D_A$ and $D_B$ are both 0, the first and second analog output signals are also 0. So, the random control signals CA and CB are both "00000000", the queues I and Q are null, and contents in the queue P are DAC elements of $E_1$ to $E_8$.

Time point $T_1$: when the digital input data DA is changed to 1 and the digital input data $D_B$ is changed to 4, the first analog output signal should be 1, and one element signal is to be outputted to the summing node 32. So, the queue I is pushed into one DAC element E1, which is pulled out from the queue P, and the first random control signal CA is changed to "00000001". Meanwhile, the second digital output signal should be 4, and four element signals are to be outputted to the summing node 33. Thus, the queue Q is pushed into four DAC elements $E_2$, $E_3$, $E_4$ and $E_5$, which are pulled out from the queue P, and the second random control signal CB is changed to "00011110". The elements of $E_6$, $E_7$, and $E_8$ are remained in the queue P.

Time point $T_2$: when the digital input data $D_A$ is changed to 2 and the digital input data $D_B$ is changed to 3, the first analog output signal should be 2, and two element signals are to be coupled to the summing node 32. So, the queue I is pushed into one element $E_6$, which is pulled out from the queue P, and the first random control signal CA is changed to "00100001". Meanwhile, the second analog output signal should be 3 and three element signals are to be coupled to the summing node 33. Thus, the queue Q is pulled out one element E2, which is pushed into the queue P, and the second random control signal CB is changed to "00011100". The elements of $E_7$, $E_8$, and $E_2$ are remained in the queue P.

Time point $T_3$: when the digital input data $D_A$ is changed to 3 and the digital input data $D_B$ is changed to 2, the first analog output signal should be 3, and three element signals are to be coupled to the summing node 32. So, the queue I is pushed into one element $E_7$, which is pulled out from the queue P, and the first random control signal CA is changed to "01100001". Meanwhile, the analog output signal B should be 2, and two element signals are to be coupled to the summing node 33. Thus, the queue Q is pulled out one element $E_3$, which is pushed into the queue P, and the second random control signal CB is changed to "00011000". The elements of $E_8$, $E_2$, and $E_3$ remain in the queue P. The signals and queues at other time points may be derived analogically.

Figure 5:
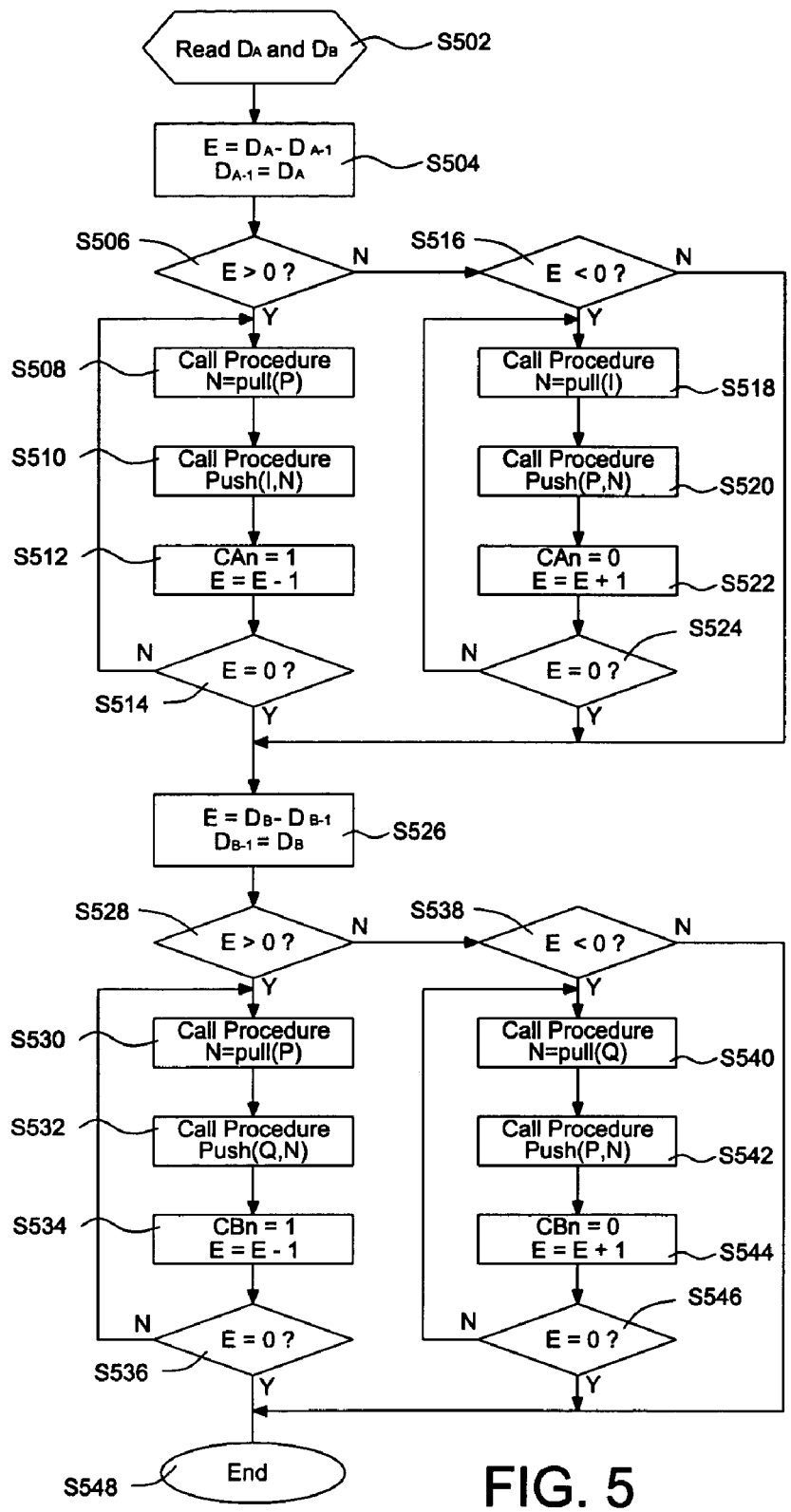
FIG. 5 shows a flow chart of a method for the random number generator of FIG. 3.

FIG. 5 shows a flow chart of a method for generating the random control signal according to an embodiment of this invention. In this embodiment, the queue P is the redundant element data of the element pool, the queue I is the element data used by the first control signal CA, and the queue Q is the element data used by the second control signal CB. The method comprises the following steps.

Step S502: read the new first and second digital input data $D_A$ and $D_B$.

Step S504: calculate the difference E between the new data $D_A$ and the current data $D_A$-1. That is, E=$D_A$-$D_A$-I. Then, the data $D_A$-1 is updated to be data $D_A$.

Step S506: If the difference E is greater than 0, it means that the new data $D_A$ is greater than the current data $D_A$-1, and at least a new element signal is to be coupled to the first summing node. If the difference E is smaller than 0, the process jumps to step S516. If the difference E is 0, the process jumps to step S526.

Step S508: call the N=pull(P) procedure. A data N is pulled out from the queue P.

Step S510: call the push(I,N) procedure. The data N is then pushed into the queue I.

Step S512: set the N-th bit of the first random control signal to 1, and the difference E is subtracted by 1.

Step S514: check whether the difference E is 0. The process jumps to step S526 if the difference E is 0; otherwise the process jumps back to step S508.

Step S516: if the difference E is smaller than 0, it means that the new data $D_A$ is smaller than the current data $D_A$-1, and the number of element signals coupled to the first summing node is to be decreased. Thus, the process jumps to step S518. If the difference E is 0, the process jumps to step S526.

Step S518: call the N=pull(I) procedure. A data N is pulled out from the queue I.

Step S520: call the push(P,N) procedure. The data N is pushed into the queue P.

Step S522: set the N-th bit of the first control data to 0, and the difference E is added by 1.

Step S524: check whether the difference E is 0. The process jumps to step S526 if the difference E is 0; or otherwise the process jumps back to step S518.

The steps S526~S546 resemble the steps S504~S524 with DA being substituted by $D_B$.

Step S548: End.

It should be noted that the flow chart of FIG. 5 is divided into two stages. The first stage from steps S504 to S524 is to set the first control data according to the first digital input data. The second stage from step S526 to S546 is to set the second control data according to the second digital input data. Consequently, if more than two analog output signals are needed, a third stage can be added, and the steps are similar to those in the second stage.

Figure 6:
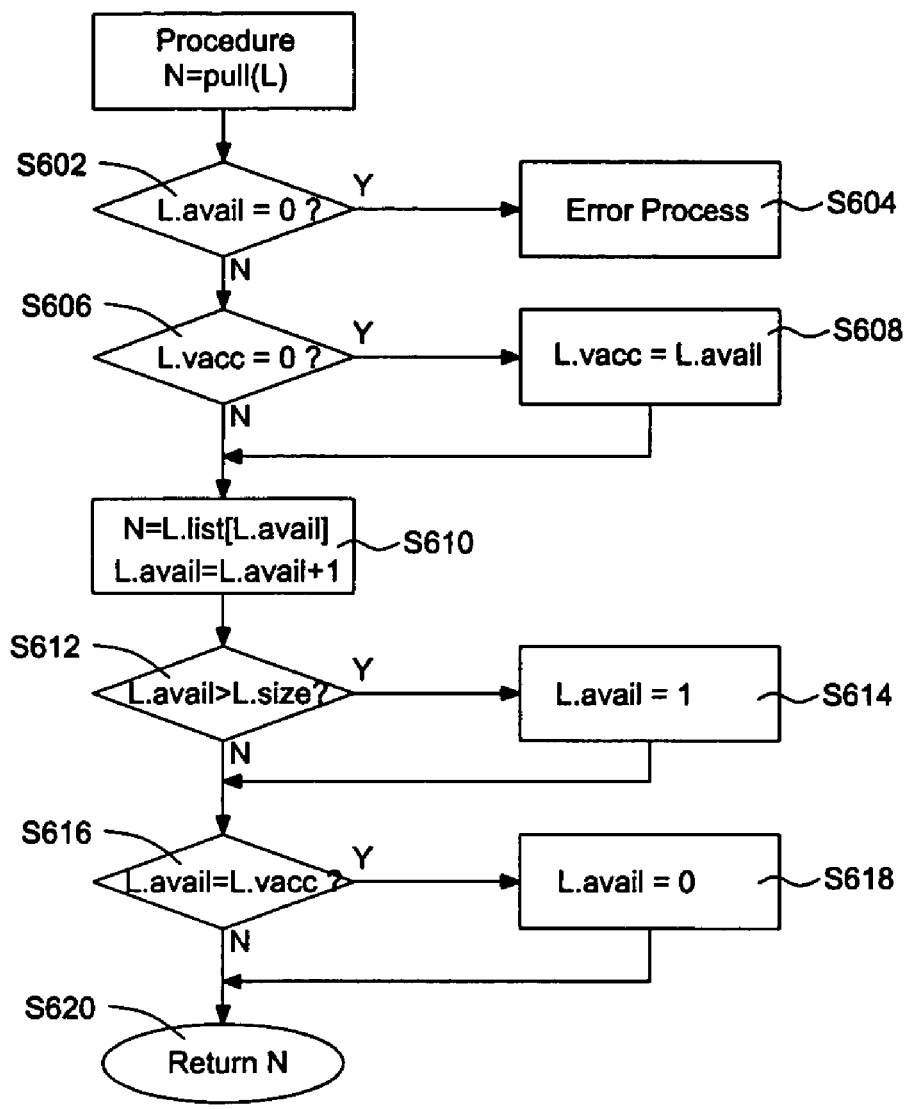
FIG. 6 shows a flow chart of the pull(L) procedure in the flow chart of FIG. 5.

FIG. 6 shows an embodiment of the pull(L) procedure of FIG. 5, wherein symbol L may represent the queue I, Q or P. Each queue has four variables, i.e., "list", "size", "avail", and "vacc", and the general forms thereof are represented by "L.list", "L.size", "L.avail", and "L.vacc". "List" is an array for storing the numbers of the elements; "size" is the maximum capacity of this queue; "avail" is the index of the elements that may be pulled out, wherein avail=0 represents that the queue is null; and "vacc" is the null index into which the element may be pushed, wherein vacc=0 represents that the queue is full. The steps of the pull(L) procedure will be described with reference to FIG. 6.

Step S602: check whether the queue is null. That is, to determine whether the L.avail is 0. When L.avail=0, it means that the queue is null, and the process jumps to the error procedure step S604, or otherwise jumps to step S606.

Step S606: check whether the queue is full. That is, to determine whether the L.vacc is 0. When L.vacc=0, it means that the queue is full, and the process jumps to step S608; or otherwise jumps to step S610.

Step S608: set the null index to the position at which the element is to be pulled out. That is, L.vacc=L.avail.

Step S610: pull the element number at the avail position in the queue, that is, N=L.list[avail], and the avail is added by 1 to indicate a next usable position.

Step S612: check whether the avail exceeds the range, i.e., determine whether the L.avail is greater than the L.size. The process jumps to step 614 if L.avail>L.size; or otherwise the process jumps to step S616.

Step S614: wrap around the L.avail to the beginning of the list, i.e., set the L.avail to 1.

Step S616: check whether the queue is null. If L.avail=L.vacc, it means that the queue is null and the process jumps to step S618; or otherwise the process jumps to step S620.

Step S618: set L.avail to be 0.

Step S620: return the N that is pulled out, and end the procedure.

Of course, in the above-mentioned procedure, steps S602 and S604 may be omitted if the output signal being negative is avoided (i.e., no condition of taking the element from the null queue exists).

Figure 7:
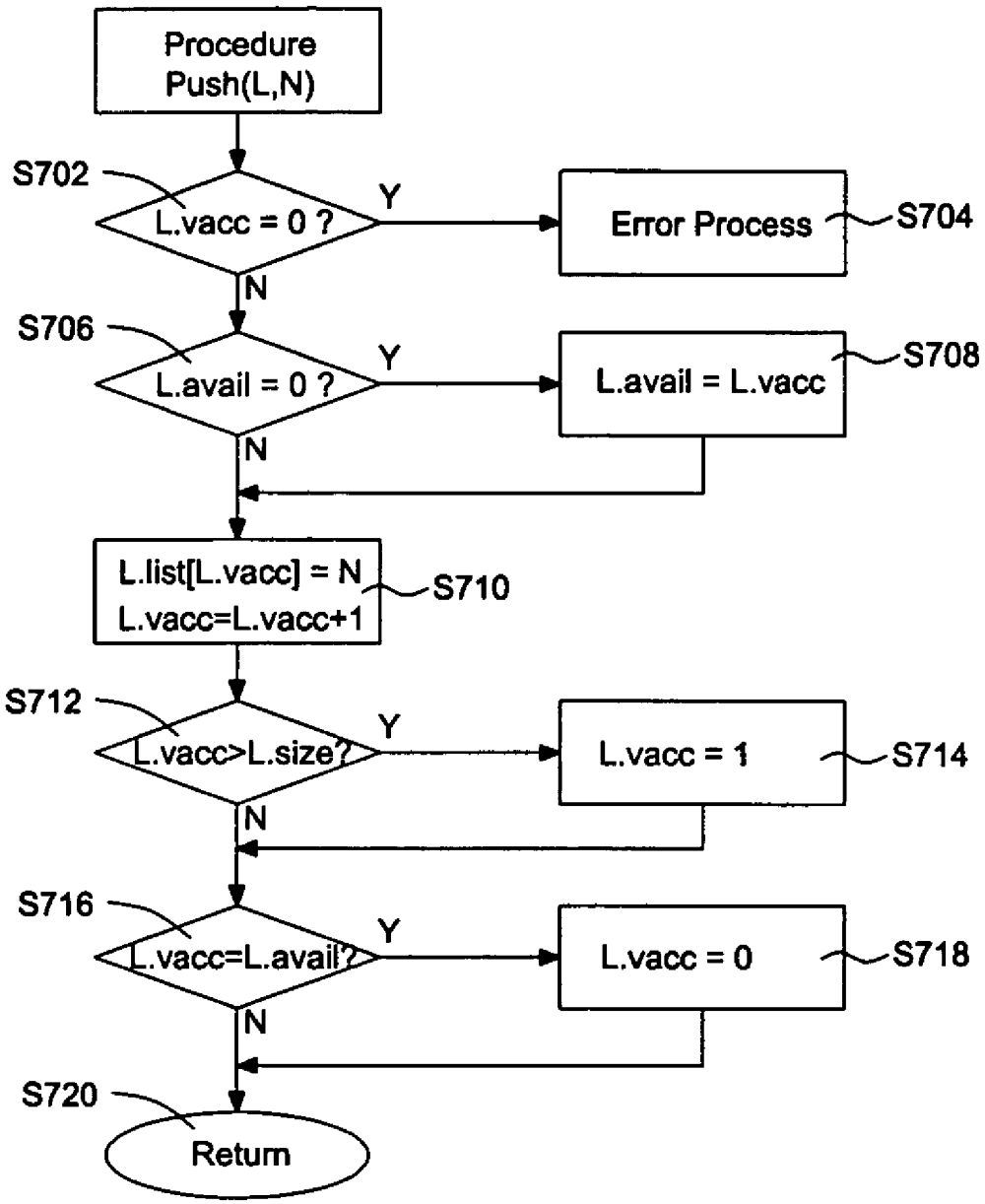
FIG. 7 shows a flow chart of the push(L,N) procedure in the flow chart of FIG. 5.

FIG. 7 shows a flow chart of the push(L,N) procedure in the flow chart of FIG. 5, wherein symbol L may represent the queue I, Q or P, and symbol N is the element number. The steps of the push(L,N) procedure will be described with reference to FIG. 7.

Step S702: check whether the queue is full, i.e., determine whether the L.vacc is 0. When L.vacc=0, it means that the queue is full, and the process jumps to step S704, or otherwise jumps to step S706.

Step S704: process the error procedure. When the queue is full, the element cannot be pushed in. So, the error processing operation is performed, and the process is temporarily terminated.

Step S706: check whether the queue is null, i.e., determine whether the L.avail is 0. When L.avail=0, it means that the queue is null, and the process jumps to step S708; or otherwise jumps to step S710.

Step S708: set the usable position to the position at which the element is to be placed. That is, L. avail=L. vacc.

Step S710: push the data N to the position of vacc in the queue, i.e., L.list[vacc]=N, and add the vacc by 1 in order to indicate a next null position.

Step S712: check whether the vacc exceeds the range, i.e., determine whether the L.vacc is greater than the L.size. If L.vacc>L.size, the process jumps to step S714, or otherwise jumps to step S716.

Step S714: wrap around the L.vacc to the beginning of the list. That is, the L.vacc is set to be 1.

Step S716: check whether the queue is full again. That is, determine whether the L.vacc equals L.avail. If L.vacc=L.avail, it means that the queue is full, and the process jumps to step S718, or otherwise jumps to step S720.

Step S718: set the L.vacc to be 0.

Step S720: return and end the procedure.

Of course, in the above-mentioned procedure, if the fact that the output signal is greater than the queue maximum can be avoided (i.e., no condition of placing the element to the full queue exists), the steps S702 and S704 may be omitted.

Please note that although in the embodiment presented above the DAC elements provide currents with substantially the same amount, other quantities of current provided by these DAC elements may also be adopted, such as a combination of 1I, 2I, 4I, 8I, . . . etc. Likewise, the randomized control signal scheme presented above is for exemplary purpose only and is not intended to serve as limitation. Other control schemes may also be adopted in the same hardware configuration.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A digital to analog converter (DAC) system for outputting a first analog output signal and a second analog output signal according to a first digital input data and a second digital input data, respectively, the DAC system comprising:

a plurality of DAC elements generating a plurality of element signals; and a control signal generator generating a control signal according to the first and the second digital input data;

a first summing node receiving a first part of the element signals according to the control signal and generating the first analog output signal; and a second summing node receiving a second part of the element signals according to the control signal and generating the second analog output signal;

wherein the control signal controls the coupling to and decoupling from the first summing node of at least one of the DAC elements, and the coupling to and decoupling from the second summing node of said at least one of the DAC elements.

2. The DAC system of claim 1, wherein at least one of the DAC elements comprises:

a basic element for generating one of the element signals; and a switch unit coupled between the basic element and the summing nodes, wherein the switch unit is controlled by a corresponding part of the control signal.

3. The DAC system of claim 2, wherein the switch unit comprises a first switch which is coupled between the basic element and the first summing node, and a second switch which is coupled between the basic element and the second summing node.

4. The DAC system of claim 2, wherein the basic elements are substantially the same.

5. The DAC system of claim 2, wherein the basic elements are resistors.

6. The DAC system of claim 2, wherein the basic elements are capacitors.

7. The DAC system of claim 2, wherein the basic elements are current sources.

8. The DAC system of claim 1, wherein the control signal generator comprises an element queue and a plurality of control queues.

9. The DAC system of claim 1, wherein the control signal generator is configured to:

read the first and the second digital input data;

compare the first digital input data with an older first digital input data to generate a first difference;

compare the second digital input data with an older second digital input data to generate a second difference; and produce the control signal according to the first and the second differences.

10. The DAC system of claim 1, wherein the control signal generator generates the control signal to randomly control the DAC elements to be coupled to the first summing node or the second summing node or both, or to be kept floating according to the corresponding control signal.

11. A method for converting a first digital input data and a second digital input data into a first analog output signal and a second analog output signal, respectively the method comprising the steps of:

producing a control signal according to the first and second digital input data;

dividing a plurality of basic elements into at least a first element set and a second element set according to the control signal; and generating the first and second analog output signals according to the first element set and the second element set, respectively;

wherein the dividing step comprises:

reading the first and the second digital input data;

comparing the first digital input data with an older first digital input data to generate a first difference;

comparing the second digital input data with an older second digital input data to generate a second difference; and producing the control signal according to the first and the second differences.

12. The method of claim 11, wherein the control signal comprises a first control signal and a second control signal, the first and the second control signals are corresponding to the first and the second differences, respectively.

13. The method of claim 11, wherein the producing step comprises:

changing the bit of an older control signal according to the first and the second differences to output the control signal.

14. A digital to analog converter (DAC) system for outputting a first analog output signal and a second analog output signal according to a first digital input data and a second digital input data, respectively, the DAC system comprising:

a plurality of DAC elements generating a plurality of element signals; and a control signal generator generating a control signal according to the first and the second digital input data;

a first summing node receiving a first part of the element signals according to the control signal and generating the first analog output signal; and a second summing node receiving a second part of the element signals according to the control signal and generating the second analog output signal;

wherein at least one of the DAC elements comprises:

a basic element for generating one of the element signals and the basic element is a resistor, a capacitor, or a current source; and a switch unit coupled between the basic element and the summing nodes and controlled by a corresponding part of the control signal.

15. A digital to analog converter (DAC) system for outputting a first analog output signal and a second analog output signal according to a first digital input data and a second digital input data, respectively, the DAC system comprising:

a plurality of DAC elements generating a plurality of element signals; and a control signal generator generating a control signal according to the first and the second digital input data;

a first summing node receiving a first part of the element signals according to the control signal and generating the first analog output signal; and a second summing node receiving a second part of the element signals according to the control signal and generating the second analog output signal; wherein the control signal generator comprises an element queue and a plurality of control queues.

16. The DAC system of claim 15, wherein at least one of the DAC elements comprises:

a basic element for generating one of the element signals; and a switch unit coupled between the basic element and the summing nodes, wherein the switch nit is controlled by a corresponding part of the control signal.

17. The DAC system of claim 16, wherein the basic element is a resistor, a capacitor, or a current source.

18. A digital to analog converter (DAC) system for outputting a first analog output signal and a second analog output signal according to a first digital input data and a second digital input data, respectively, the DAC system comprising:
- a plurality of DAC elements generating a plurality of element signals; and
- a control signal generator generating a control signal according to the first and the second digital input data;
- a first summing node receiving a first part of the element signals according to the control signal and generating the first analog output signal; and
- a second summing node receiving a second part of the element signals according to the control signal and generating the second analog output signal;
- wherein the control signal generator generates the control signal to randomly control the DAC elements to be coupled to the first summing node or the second summing node or both, or to be kept floating according to the corresponding control signal.

19. The DAC system of claim 18, wherein at least one of the DAC elements comprises:
- a basic element for generating one of the element signals; and
- a switch unit coupled between the basic element and the summing nodes, wherein the switch unit is controlled by a corresponding part of the control signal.

20. The DAC system of claim 19, wherein the basic element is a resistor, a capacitor, or a current source.

* * * * *